(12) United States Patent
Cheng et al.

(10) Patent No.: US 6,673,652 B1
(45) Date of Patent: Jan. 6, 2004

(54) UNDERFILLING METHOD FOR A FLIP-CHIP PACKAGING PROCESS

(75) Inventors: Jao-Chin Cheng, Hsinchu (TW); Ming-Hsien Chen, Hsinchu (TW)

(73) Assignee: Amic Technology, Inc., Hsinchu (TW)

( * ) Notice: Subject to any disclaimer, the term of this patent is extended or adjusted under 35 U.S.C. 154(b) by 0 days.

(21) Appl. No.: 09/128,226

(22) Filed: Aug. 3, 1998

(51) Int. Cl.[7] .............................................. H01L 21/44
(52) U.S. Cl. ........................ 438/108; 438/118; 438/613; 257/783
(58) Field of Search ................................ 438/106, 107, 438/108, 118, 119, 113, 114, 613, 632; 257/783

(56) References Cited

U.S. PATENT DOCUMENTS

| | | | | |
|---|---|---|---|---|
| 4,515,828 A | * | 5/1985 | Economy et al. | 427/82 |
| 5,861,322 A | * | 6/1995 | Caillat et al. | 438/107 |
| 5,736,424 A | * | 8/1996 | Prybyla et al. | 437/228 |
| 5,956,605 A | * | 9/1996 | Akram et al. | 438/613 |
| 5,861,678 A | * | 12/1997 | Schrock | 257/783 |
| 5,975,408 A | * | 11/1999 | Goossen | 228/173.2 |

OTHER PUBLICATIONS

Charles A. Harper, Electronic Packaging and Interconnection Handbook 2nd Edition, (McGraw–Hill, New York, 1997), pp. 5.52–5.53, 10.29–10.34.*
Stanley Wolf, Silicon Process for the VLSI Era vol. 2 Process Integration, (Lattice Press, California, 1990), pp. 199–207, 214–217.*

* cited by examiner

Primary Examiner—Richard Elms
Assistant Examiner—Christian D. Wilson
(74) Attorney, Agent, or Firm—Thomas, Kayden, Horstemeyer & Risley

(57) ABSTRACT

An underfilling method for a flip-chip packaging process includes coating a underfill material layer over bumps on a semiconductor substrate, performing a die sawing process on the semiconductor substrate to from a number of dies, and performing a flip-chip process on each of the dies to adhere each of the dies to another substrate. Because the underfill material is coated from the top of the bumps, the air-trapping problem can be eliminated. The process time is shortened to improve yield because the underfill material is dispensed over all the dies before the die-sawing process. This is different from the conventional underfilling process, which has to dispense underfill material and seal edges on each individual die.

4 Claims, 3 Drawing Sheets

UNDERFILLING METHOD FOR A FLIP-CHIP PACKAGING PROCESS

BACKGROUND OF THE INVENTION

1. Field of the Invention

This invention relates to a packaging process, and more particularly, to an underfilling method for a flip-chip packaging process.

2. Description of Related Art

It has been a goal of semiconductor manufacturers to develop and a semiconductor integrated circuit(IC) device of a higher integration, while physically downsizing the IC device. A higher-integration, or a higher-density, IC device results in more bonding pads and requires more electrical connections. The packaging techniques for integrated IC have been improved according to the increasing integration of IC devices since the beginning of the semiconductor industry in the early 60s. The wire bonding packaging techniques, such as metal can-type, dual in-line packaging (DIP), can no longer meet the packaging needs of a high-integration IC, taking into consideration the large number of electrical connections and the arrangement of those electrical connections. On the other hand, the techniques that do not apply wire bonding packaging techniques, such as the tape-automated bonding technique, and the flip-chip packaging which was first introduced by IBM in 1964, are still used by the industrial nowadays for packaging a highly integrated IC device. The flip-chip packaging process, because it allows high input/output density, improves electrical performance, is self-aligned, and has a low cost potential, has become a trend for packaging a high-integration IC.

A conventional flip-chip packaging process includes a bumping process, a die-sawing process, a flip-chip process, and an underfilling process, as shown in FIGS. 1A through 1C. Referring to FIG. 1A, a number of metal bumps 106 are formed on pads 102 located on a provided substrate 100. The pads and a passivation layer 104 are formed on the substrate 100 before the bumping process, wherein the passivation layer 104 covers the substrate 100 and expose the pads 102. Since the bumps 106 don't completely fill the space over the pads 102 in the passivation layer 104, there are some extra spaces 105 between the bumps 106 and the passivation layer 104.

Referring to FIG. 1B, a polishing process is performed to remove the top portion of the bumps 106 to make all the bumps 106 the same height in height, and additionally, to increase the tip areas 107. The height H 109 of the portion of the bumps 106 above the top surface of the passivation layer 104 is still greater than zero after the polishing process. A die-sawing process is performed on the substrate 100 to separate each individual die from the processed wafer.

Referring to FIG. 1C, a flip-chip process is performed by picking up each separated die 120, turning the die 120 over, and attaching the die 120 to a desired position on a target substrate 110 which contains pre-formed connectors 112. By applying a high-temperature environment and proper stress on the die 120, the bumps 106 melt and adhere to the desired substrate 110. In order to dissipate the stress and improve the fatigue life caused by the coefficient of thermal expanding (CTE) mismatch on the bumps 106 and adhesive, an underfill material 114 is introduced into the area between the die 120 and the adhered substrate 110. The exposed surfaces on the pads 102 can also be protected by filling underfill material 114 into the spaces 105.

However, the foregoing conventional flip-chip packaging process still has several drawbacks, such as requiring a long process time and air-trapping problems, so the yield is limited. In a conventional underfilling process, because the underfill material 114 is introduced into the space between the die 120 and the adhered substrate 110 from the edges of the die 120, air tends toward being trapped between the die 120 and the adhered substrate 110. Different underfill dispense patterns developed to resolve the air-trapping problem improve the air-trapping problem, but those underfill dispense patterns are very time-consuming which limits the yield in another way.

SUMMARY OF THE INVENTION

It is therefore an objective of the present invention to provide an underfilling method for a flip-chip packaging process including coating a layer of underfill material on a substrate before the die-sawing process to eliminate the air-trapping problem and simplify the underfilling process.

In accordance with the foregoing and other objectives of the present invention, a layer of an underfill material is coated on the passivation layer before the die-sawing process, so that the air-trapping problem can be eliminated and the process time is shortened.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new underfilling method for a flip-chip packaging process that improves the air-trapping problem, which occurs in a conventional underfilling process, and reduces the process time.

A preferred embodiment according to the invention is shown in FIGS. 2A through 2D and is described in detail as following.

Figure 1A:
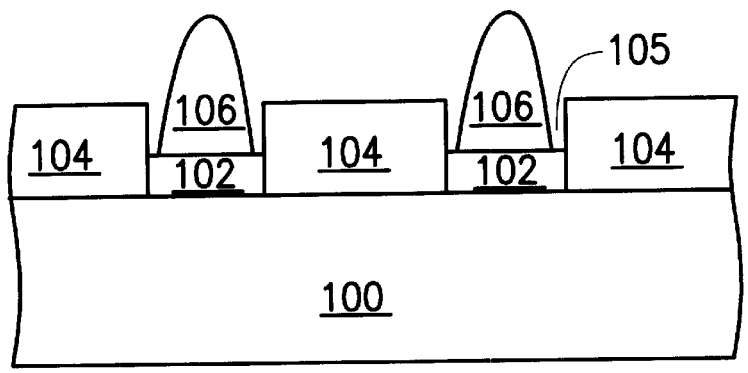
FIGS. 1A through 1C are cross-sectional views showing a conventional underfilling method for a flip-chip packaging process.
Figure 1B:
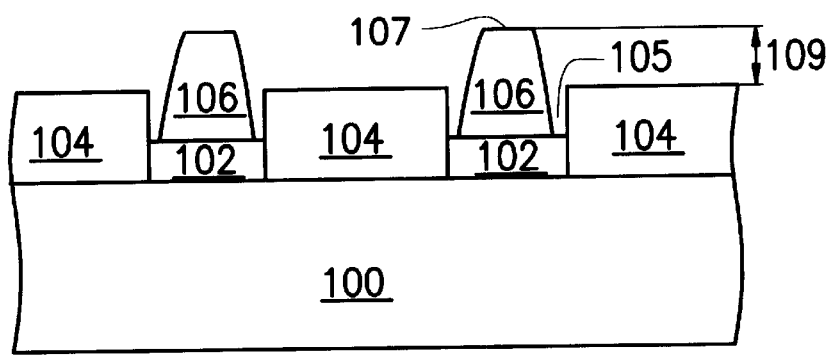
Figure 1C:
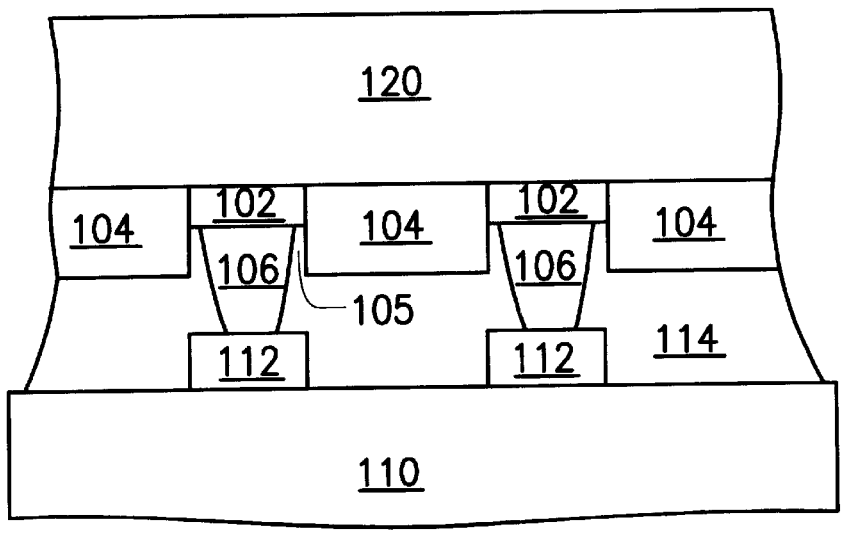
Figure 2A:
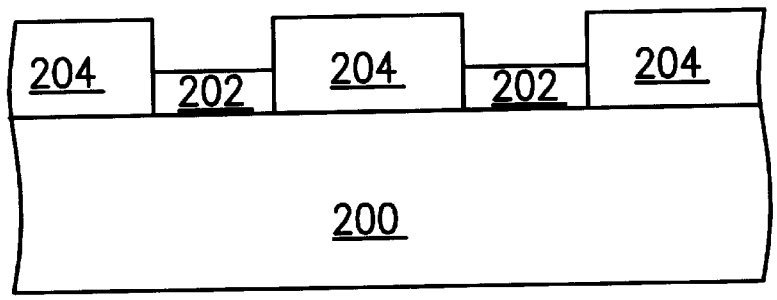
FIG. 2A through 2F are cross-sectional views showing the underfilling method for a flip-chip packaging process used in a preferred embodiment according to the invention.
Figure 2B:
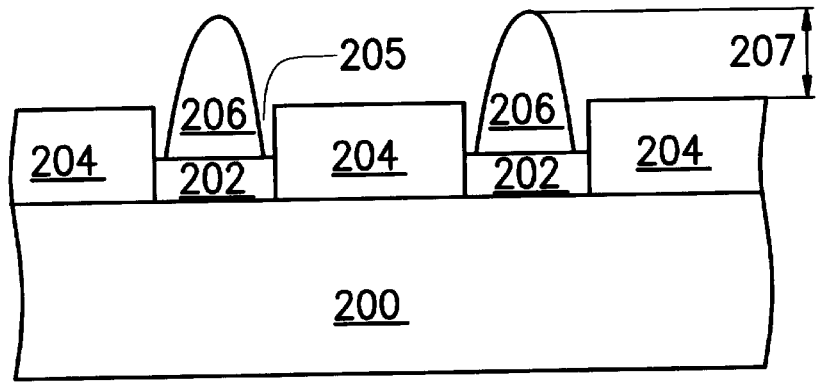

In FIG. 2A, a provided substrate 200 contains pads 202 and a passivation layer 204. Referring next to FIG. 2B, bumps 206, of a material such as Au or solder, are formed on the pads 202 with a height 207 measured from the top of the passivation layer 204. Since a bump 206 is not able to cover the surface of a pad 202, there is a space 205 existing between the bump 206 and the passivation layer 204 over every pad 202. One of the reasons for applying an underfilling process in a flip-chip packaging is to protect the exposed areas on the pads 202 by filling the space 205 with underfill material.

Figure 2C:
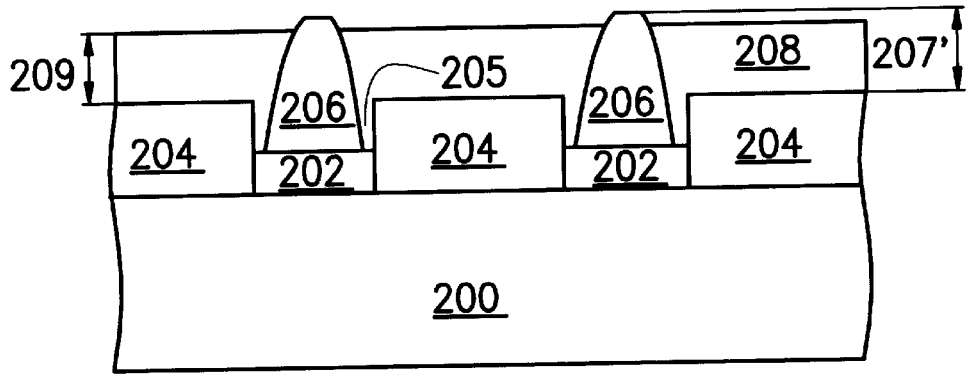

Referring to FIG. 2C, a layer of underfill material, such as epoxy resin or polyamides relatives, of a thickness 209 is formed on the substrate 200. The thickness 209 of the underfill material 208 is less than the height 207 of the bumps 206 measured from the top of the passivation layer 204, and is about ten times larger than the thickness of the passivation layer 204. Because the underfill material is filled from the top, the coverage, especially the coverage over the space 205 is better than that in a conventional underfilling process. Not only is the air-trapping problem eliminated, the underfilling method for a flip-chip packaging process according to the invention can also improve the stress absorbing, making the structure more able to provide the connection of the bumps with protection from fatigue failure.

Then, a polishing process is performed to remove the tips of the bumps 206 to ensure that all bumps 206 are equally high, and to enlarge the top areas of the bumps 206. The height 207' of the bumps measured from the top of the passivation layer 204 after the polishing process is still higher than the thickness 209 of the underfill material 208. A die-sawing process is then performed to form individual dies 250.

Figure 2D:
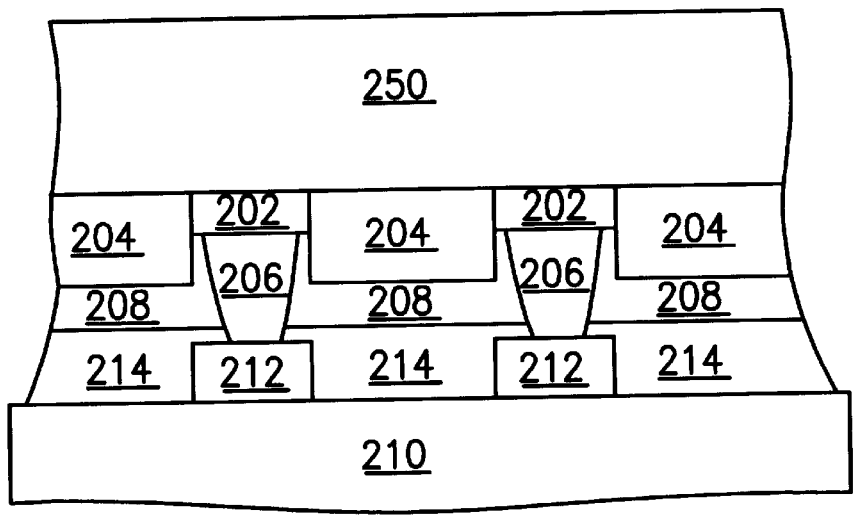

Referring next to FIG. 2D, a flip-chip process is performed to adhere each of the dies 250 to a desired board or another substrate 210 by applying pressure and heat on the die 250, wherein the desired board or substrate 210 contains pads 212. The bumps 206 are melted and electrically connected to the pads 212. The underfill material 208 is then subjected to a reflow process and a curing process. An optional, conventional underfilling process can be performed after the flip-chip process, to form another underfill material layer 214 between the first underfill material layer 208 and the substrate 210, which enhances the functions of the underfill material layer 208. The enhancing underfill material layer 214 needs a reflow process and a curing process as well.

Because the underfill material 208 is coated over the substrate 200 before the die-sawing process, it is possible to skip a conventional, time-consuming underfilling process applied on each die that would include dispensing underfill material, letting the underfill material flow under the die, and edge sealing. In result, the underfilling method for a flip-chip packaging process according to the invention improves yield.

Figure 2E:
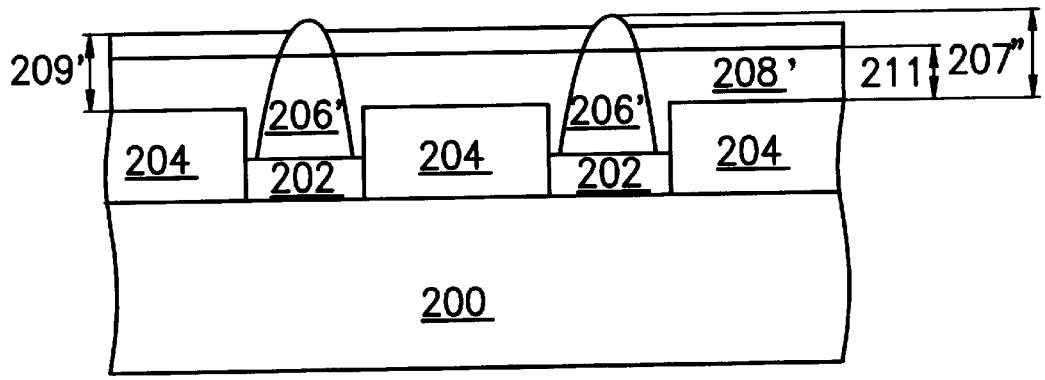
Figure 2F:
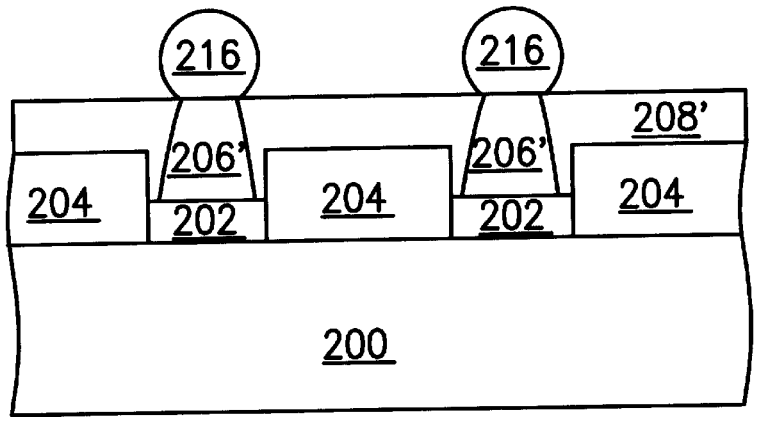

Another embodiment according to the invention is shown in FIGS. 2E and 2F.

FIG. 2E shows a number of first bumps 206', of a material such as Au or others, formed on the pads 202 of a provided substrate 200, wherein the height of the first bumps 206' measured from the top of the passivation layer 204 is 207". Then, a layer of underfill material 208' is formed on the substrate 200, wherein the thickness 209' of the underfill material layer 208' is still less than the height of the first bumps 206', 207", and is at least ten times thicker than the thickness of the passivation layer 204. Then, a polishing process is performed to make the first bumps 206' and the underfill material 208' equally high.

FIG. 2F shows the next step, in which a number of second bumps 216 are formed on the first bumps 206', wherein the second bumps 216 are of a material that includes solder. Then, a die-sawing process is performed before the flip-chip process. Again, each of the dies is adhered to a desired board or another substrate through a flip-chip process similar to the one shown in FIG. 2D. It is also an option to have another underfill material layer formed between the adhesive substrate and the underfill material 208' to enhance the performance of the underfill material.

According to the foregoing, the underfilling method for a flip-chip packaging process of the invention improves air-trapping problem, which occurs during a conventional underfilling process, and shortens the underfilling process as well. The underfill material formed by the invention can further provide more protection for the adhesion of the die by absorbing more stress.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An underfilling method for a flip-chip packaging process, the method comprising:

providing a first semiconductor substrate, wherein the first semiconductor substrate has at least a plurality of pads and a passivation layer, wherein the passivation layer is formed over the substrate but exposes the pads, and wherein the passivation layer is thicker than the pads;

forming a plurality of bumps on the pads, wherein the bumps have a first height and an air space is naturally formed between sides of the bumps and the passivation layer;

coating a first underfill material layer over the first semiconductor substrate at least filling the air space, wherein a thickness of the first underfill material layer is less than the first height of the bumps;

performing a die sawing process on the first semiconductor substrate to form a plurality of dies;

performing a flip-chip process on each of the dies to adhere each of the dies to a second substrate; and performing an underfilling process to form a second underfill material layer between the second substrate and the first underfill material layer after the step of performing the flip-chip process on each of the dies.

2. The underfilling method of claim 1, wherein the second underfill material includes epoxy resin or polyamides relatives.

3. An underfilling method for a flip-chip packaging process, the method comprising:

providing a first semiconductor substrate, wherein the first semiconductor substrate has at least a plurality of pads and a passivation layer, wherein the passivation layer is formed over the substrate and exposes the pads, and wherein the passivation layer is thicker than the pads;

forming a plurality of first bumps on the pads, wherein the first bumps have a first height and an air space is naturally formed between sides of the bumps and the passivation layer;

coating a first underfill material layer over the first substrate at least filling the air space, wherein a thickness of the first underfill material layer is about the same as the first height of the first bumps;

performing a polishing process to increase an exposed top surface area of each of the first bumps;

forming a plurality of second bumps on the exposed top surface areas of the first bumps;

performing a die sawing process on the first semiconductor substrate to form a plurality of dies;

performing a flip-chip process on each of the dies to adhere each of the dies to a second substrate; and performing an underfilling process to form a second underfill material layer between the second substrate and the first underfill material layer after the step of performing the flip-chip process on each of the dies.

4. The underfilling method of claim 3, wherein the second underfill material includes epoxy resin or polyamides relatives.

* * * * *